US 8,809,842 B2

(12) United States Patent
Song et al.

(10) Patent No.: US 8,809,842 B2
(45) Date of Patent: Aug. 19, 2014

(54) DONOR FILM, METHOD FOR MANUFACTURING ORGANIC LIGHT EMITTING DIODE DISPLAY USING THE SAME, AND ORGANIC LIGHT EMITTING DIODE DISPLAY MANUFACTURED BY USING THE METHOD

(75) Inventors: Ha-Jin Song, Yongin (KR); Sang-Woo Pyo, Yongin (KR); Byeong-Wook Yoo, Yongin (KR); Hyo-Yeon Kim, Yongin (KR); Ji-Young Kwon, Yongin (KR); Hye-Yeon Shim, Yongin (KR); Kwan-Hee Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/437,555

(22) Filed: Apr. 2, 2012

(65) Prior Publication Data
US 2013/0175550 A1 Jul. 11, 2013

(30) Foreign Application Priority Data
Jan. 9, 2012 (KR) .................. 10-2012-0002553

(51) Int. Cl.
*H01L 51/52* (2006.01)
(52) U.S. Cl.
USPC .......................................... 257/40

(58) Field of Classification Search
USPC ................. 257/40, 88; 313/504; 438/99
See application file for complete search history.

(56) References Cited

U.S. PATENT DOCUMENTS

| 7,598,115 B2 * | 10/2009 | Song et al. ............... 438/99 |
| 2012/0021230 A1 * | 1/2012 | Fukatani et al. ............ 428/426 |
| 2013/0153866 A1 * | 6/2013 | Chen et al. ............... 257/40 |

FOREIGN PATENT DOCUMENTS

| JP | 4352474 | 8/2009 |
| KR | 10-2005-0023001 | 3/2005 |
| KR | 10-2006-0089839 | 8/2006 |
| KR | 10-2007-0049003 | 5/2007 |
| KR | 10-0843551 | 6/2008 |

* cited by examiner

*Primary Examiner* — Matthew W Such
*Assistant Examiner* — Warren H Kilpatrick
(74) *Attorney, Agent, or Firm* — Robert E. Bushnell, Esq.

(57) ABSTRACT

In a donor film, an organic light emitting diode display manufacturing method using the same, and an organic light emitting diode display manufactured by using the method, the donor film includes a donor substrate and a transfer layer formed on the donor substrate. The donor substrate includes a base film, a light-to-heat conversion (LTHC) layer disposed on the base film, and a curved interlayer film provided on the light-to-heat conversion layer and having a wrinkled side. The transfer layer includes an organic emission layer which is formed so as to be curved along a shape of the wrinkled side of the curved interlayer film.

12 Claims, 3 Drawing Sheets

DONOR FILM, METHOD FOR MANUFACTURING ORGANIC LIGHT EMITTING DIODE DISPLAY USING THE SAME, AND ORGANIC LIGHT EMITTING DIODE DISPLAY MANUFACTURED BY USING THE METHOD

CLAIM OF PRIORITY

This application makes reference to, incorporates the same herein, and claims all benefits accruing under 35 U.S.C. §119 from an application earlier filed in the Korean Intellectual Property Office on the 9 Jan. 2012 and there duly assigned Serial No. 10-2012-0002553.

BACKGROUND OF THE INVENTION

1. Field of the Invention

The present invention relates generally to a donor film, a method for manufacturing an organic light emitting diode (OLED) display using the same, and an organic light emitting diode (OLED) display manufactured by using the method.

2. Description of the Related Art

An organic light emitting element used for a flat panel display includes an anode, a cathode, and organic films provided between the anode and the cathode. The organic films include an emission layer, a hole injection layer (HIL), a hole transport layer (HTL), an electron transport layer (ETL), and an electron injection layer (EIL). The organic light emitting element is classified as a polymer organic light emitting element and a small molecular organic light emitting element depending on the material that forms the organic film, particularly, the emission layer.

In order for the organic light emitting element to realize full colors, the organic films must be patterned. The patterning methods include a method for using a shadow mask in the case of the small molecular organic light emitting element, and a laser induced thermal imaging (LITI) method by ink-jet printing or laser beams in the case of the organic light emitting element. The LITI method has the advantage of minutely patterning the organic film, and it is advantageously a dry process while the ink-jet printing is a wet process.

A method for forming a pattern of a polymer organic film according to the LITI method requires a light source, an acceptor substrate, and a donor film. The acceptor substrate represents a display substrate on which the organic film will be formed, and the donor film includes a base film, a light-to-heat conversion layer, and a transfer layer consisting of an organic film.

The organic film is patterned on the acceptor substrate when the laser beams outputted by a light source are absorbed into a light-to-heat conversion layer of the donor film and are then changed into heat energy, and the organic film forming the transfer layer is transferred to the acceptor substrate by the heat energy.

However, the transferred organic film has poor adhesion with other layers.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide a donor film for transferring an organic film having excellent adhesion and improving luminous efficiency.

The present invention has also been developed in an effort to provide a method for manufacturing an organic light emitting diode (OLED) display by using the donor film.

The present invention has also been developed in an effort to provide an organic light emitting diode (OLED) display with excellent interlayer adhesion and luminous efficiency through the manufacturing method.

An exemplary embodiment of the invention provides a donor film including a donor substrate and a transfer layer formed on the donor substrate.

The donor substrate includes: a base film; a light-to-heat conversion (LTHC) layer provided on the base film; and a curved interlayer film provided on the light-to-heat conversion layer and having a wrinkled side.

The transfer layer includes an organic emission layer that is formed so as to be curved along a shape of the wrinkled side on the wrinkled side of the curved interlayer film.

The transfer layer further includes a charge generation layer (CGL) or an organic intermediate layer formed on the organic emission layer.

The transfer layer further includes an assistance layer formed between the organic emission layer and the charge generation layer or the organic intermediate layer.

The curve of an interface between the organic emission layer and the assistance layer is relatively gentler than the curve of an interface between the curved interlayer film and the organic emission layer.

The curve of the interface between the assistance layer and the charge generation layer or the organic intermediate layer is relatively gentler than the curve of an interface between the organic emission layer and the assistance layer.

The curved interlayer film is made of an acrylic resin, an alkyd resin, or a silicone polymer.

Another embodiment of the invention provides a method for manufacturing an organic light emitting diode (OLED) display, including: forming a first electrode on a display substrate; providing a donor substrate including a base film, a light-to-heat conversion (LTHC) layer provided on the base film, and a curved interlayer film provided on the light-to-heat conversion layer and having a wrinkled side, and a donor film including a transfer layer including an organic emission layer formed so as to be curved along a shape of the wrinkled side on the wrinkled side of the curved interlayer film; disposing the donor film on the display substrate so that the transfer layer may face the first electrode; transferring the transfer layer onto the first electrode by irradiating laser beams on the donor film; and separating the donor substrate from the transfer layer.

The transfer layer further includes a charge generation layer (CGL) or an organic intermediate layer formed on the organic emission layer.

The transfer layer further includes an assistance layer between the organic emission layer and the charge generation layer or the organic intermediate layer.

The curve of an interface between the organic emission layer and the assistance layer is relatively gentler than the curve of an interface between the curved interlayer film and the organic emission layer.

The curve of an interface between the assistance layer and the charge generation layer or the organic intermediate layer is relatively gentler than the curve of an interface between the organic emission layer and the assistance layer.

The method further includes the step, before transferring the transfer layer, of forming at least one of a hole injection layer (HIL) and a hole transport layer (HTL) on the first electrode.

The curved interlayer film is made of an acrylic resin, an alkyd resin, or a silicone polymer.

The method further includes the step, when the donor substrate is separated, of forming a second electrode on the organic emission layer.

The method further includes the step, before the second electrode is formed, of forming at least one of an electron transport layer (ETL) and an electron injection layer (EIL) on the organic emission layer.

The curve of an interface between at least one of the electron transport layer (ETL) and the electron injection layer (EIL) and the second electrode is relatively gentler than the curve of an interface between the organic emission layer and at least one of the electron transport layer (ETL) and the electron injection layer (EIL).

Yet another embodiment of the invention provides an organic light emitting diode display including: a display substrate; a first electrode formed on the display substrate; a charge generation layer or an organic intermediate layer formed on the first electrode; an assistance layer formed on the charge generation layer or the organic intermediate layer; an organic emission layer formed on the assistance layer and formed so as to be wrinkled; and a second electrode formed on the organic emission layer.

The curve of an interface between the organic emission layer and the assistance layer is relatively gentler than the curve of an interface between the curved interlayer film and the organic emission layer.

The curve of an interface between the assistance layer and the charge generation layer or the organic intermediate layer is relatively gentler than the curve of an interface between the organic emission layer and the assistance layer.

The organic light emitting diode display further includes at least one of an electron transport layer (ETL) and an electron injection layer (EIL) formed between the organic emission layer and the second electrode.

The curve of an interface between at least one of the electron transport layer (ETL) and the electron injection layer (EIL) and the second electrode is relatively gentler than the curve of an interface between the organic emission layer and at least one of the electron transport layer (ETL) and the electron injection layer (EIL).

The curved interlayer film is made of an acrylic resin, an alkyd resin, or a silicone polymer.

The organic light emitting diode display further includes at least one of a hole injection layer (HIL) and a hole transport layer (HTL) formed between the first electrode and the charge generation layer or the organic intermediate layer.

According to the embodiments of the invention, the donor film can transfer the organic film so as to have excellent adhesion and to improve luminous efficiency.

Also, the method for manufacturing the organic light emitting diode (OLED) display can stably manufacture the organic light emitting diode (OLED) display by using the donor film.

Furthermore, the organic light emitting diode (OLED) display can have excellent interlayer adhesion and luminous efficiency by using the donor film and the manufacturing method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
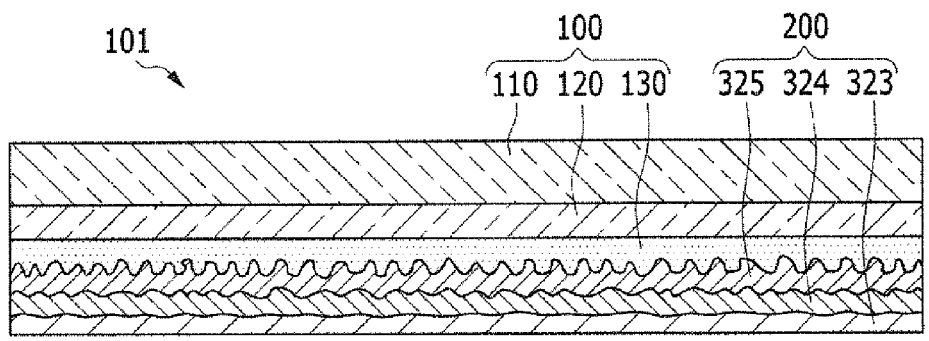
FIG. 1 shows a cross-sectional view of a donor film according to an exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Drawings may be roughly illustrated, and scales of elements may not be accurate. In the drawings, sizes or ratio of elements may be exaggerated or reduced for clarity. However, the present invention is not limited to the sizes or ratio of elements illustrated in the drawings. Like reference numerals designate like elements throughout the specification. It will be understood that when an element such as a layer, film, region or substrate is referred to as being "on" another element, it can be directly on the other element or intervening elements may also be present.

An exemplary embodiment may be described in detail as an ideal exemplary embodiment. As a result, the described embodiments may be modified in various different ways, all without departing from the spirit or scope of the present invention. Therefore, an exemplary embodiment is not limited to a specific form of a region illustrated in the drawings. For example, a form may be modified in various ways.

FIG. 1 shows a cross-sectional view of a donor film according to an exemplary embodiment of the invention.

As shown in FIG. 1, the donor film 101 includes a donor substrate 100 and a transfer layer 200 formed on the donor substrate 100.

The donor substrate 100 includes a base film 110, a light-to-heat conversion (LTHC) layer 120, and a curved interlayer film 130.

The base film 110 is made of transparent polymer materials manufactured by using polyester, such as polyethylene terephthalate, polyacryl, polyepoxy, polyethylene, or polystyrene. Among them, a polyethylene terephthalate film is generally used. The base film 110 must have appropriate optical characteristics and sufficient mechanical stability as a support film. Therefore, it is desirable for the base film 110 to be 10 μm to 500 μm in thickness.

The light-to-heat conversion layer 120 is formed on the base film 110. The light-to-heat conversion layer 120 absorbs light in the infrared-visible ray region and converts a part of the light into heat, it must have appropriate optical density, and it includes a light absorbing material. For example, the light-to-heat conversion layer 120 can be a metal film including aluminum oxide or aluminum sulfide as a light absorbing material, or a polymer organic film including carbon black, graphite or infrared dye as a light absorbing material. In this instance, it is desirable to form the metal film so as to be 100 Å to 5000 Å in thickness by using vacuum deposition, electron beam deposition, or sputtering. It is desirable to form the organic film so as to be 0.1 μm to 10 μm in thickness by using roll coating which is a general film coating method, gravure coating, extrusion coating, spin coating, or knife coating.

The curved interlayer film 130 is formed on the light-to-heat conversion layer 120. The curved interlayer film 130 prevents the light absorbing material included in the light-to-heat conversion layer 120 (for example, carbon black) from contaminating the transfer layer which is formed in a subsequent process. Also, the curved interlayer film 130 improves adhesion between the donor substrate 100 and the transfer layer 200.

Furthermore, the curved interlayer film 130 can function as a buffer for preventing the acceptor substrate (that is, a display substrate 510 shown in FIG. 2 or a layer formed on the substrate 510) from being damaged.

The curved interlayer film 130 can be formed with acrylic resin or alkyd resin, or it can be formed with a silicone polymer.

The curved interlayer film 130 has one wrinkled side. In detail, the curved interlayer film 130 is formed so as to have one wrinkled side that faces the light-to-heat conversion layer 120. The wrinkled side of the curved interlayer film 130 can be manufactured by a person skilled in the art through various methods that are known.

The transfer layer 200 includes an organic emission layer 325. Also, the transfer layer 200 can further include a charge generation layer (CGL) 323 formed on the organic emission layer 325, or an organic intermediate layer. In addition, the transfer layer 200 can further include an assistance layer 324 between the organic emission layer 325 and the charge generation layer 323 or the organic intermediate layer. That is, the assistance layer 324, the charge generation layer 323, or the organic intermediate layer can be omitted depending on the cases.

The organic emission layer 325 represents a layer for the organic light emitting element 300 to generate light, and can be formed with various materials and types that are known to a person skilled in the art.

For example, small molecular materials, such as Alq3 (host)/DCJTB (fluorescent dopant), Alq3 (host)/DCM (fluorescent dopant), CBP (host)/PtOEP (phosphorescent organic metal complex) that are red light emitting materials and polymer materials such as a PFO-based polymer or PPV-based polymer, are usable for the organic emission layer 325. Also, small molecular materials, such as Alq3, Alq3 (host)/C545t (dopant), or CBP (host)/IrPPy (phosphorescent organic metal complex) that are green light emitting materials and polymer materials such as PFO-based polymer or PPV-based polymer, are usable for the same. Furthermore, small molecular materials, such as DPVBi, spiro-DPVBi, spiro-6P, distyrylbenzene (DSB), or distyrylarylene (DSA) that are blue light emitting materials and polymer materials such as a PFO-based polymer or PPV-based polymer, are usable for the same.

When a voltage is applied to the charge generation layer 323, holes and electrons are generated and recombined with electrons or holes that are injected from the outside so as to emit light. Therefore, a large amount of photons are generated by the amount of the charges that are generated in it. The charge generation layer 323 can be manufactured with a material that is known to a person skilled in the art.

The organic intermediate layer includes a predetermined material for improving an interface characteristic during a transfer process. The predetermined material includes materials that are known to a person skilled in the art.

The assistance layer 324 includes at least one of a hole transport layer and an electron injection layer (EIL). It functions as a protection layer, and it can be a resonance layer. That is, the organic intermediate layer 324 includes at least one of various function layers that are known to a person skilled in the art.

The organic emission layer 325 is formed in a curved manner along a shape of the wrinkled side on the wrinkled side of the curved interlayer film 130 of the donor substrate 100. The curve of the interface between the organic emission layer 325 and the assistance layer 324 is relatively gently formed compared to the curve of the interface between the curved interlayer film 130 and the organic emission layer 325. Furthermore, the curve of the interface between the assistance layer 324 and the charge generation layer 323 or the organic intermediate layer is relatively gently formed compared to the curve of the interface between the organic emission layer 325 and the assistance layer (324).

According to the above-described configuration, the donor film 101 can transfer the organic film so that it can have excellent adhesion, and can also improve luminous efficiency.

In detail, luminous efficiency is improved and adhesion is also improved by the curved organic emission layer 325.

A method for manufacturing an organic light emitting diode (OLED) display using a donor film according to an exemplary embodiment will now be described with reference to FIG. 2 to FIG. 5.

Figure 2:
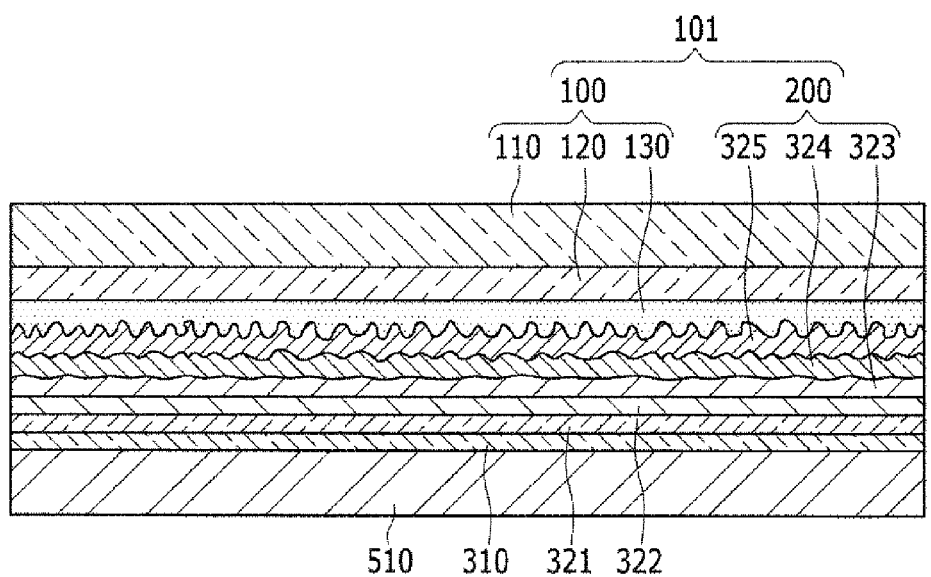
FIG. 2 to FIG. 4 sequentially show cross-sectional views for describing a method for manufacturing an organic light emitting diode display using a donor film of FIG. 1.
Figure 3:
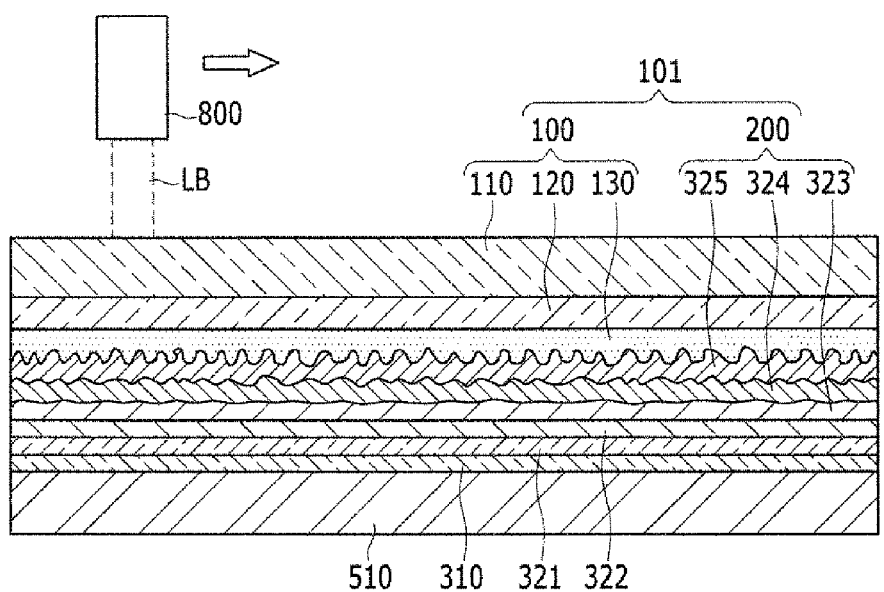
Figure 4:
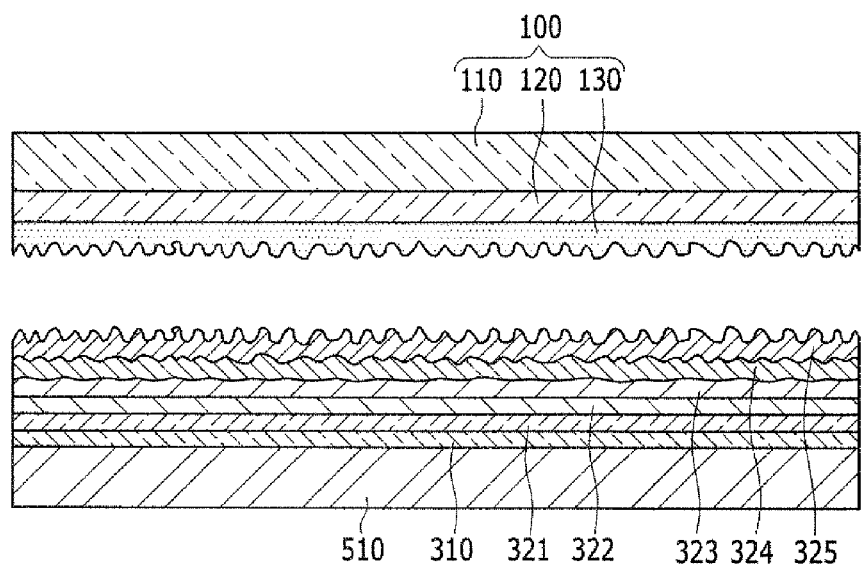
Figure 5:
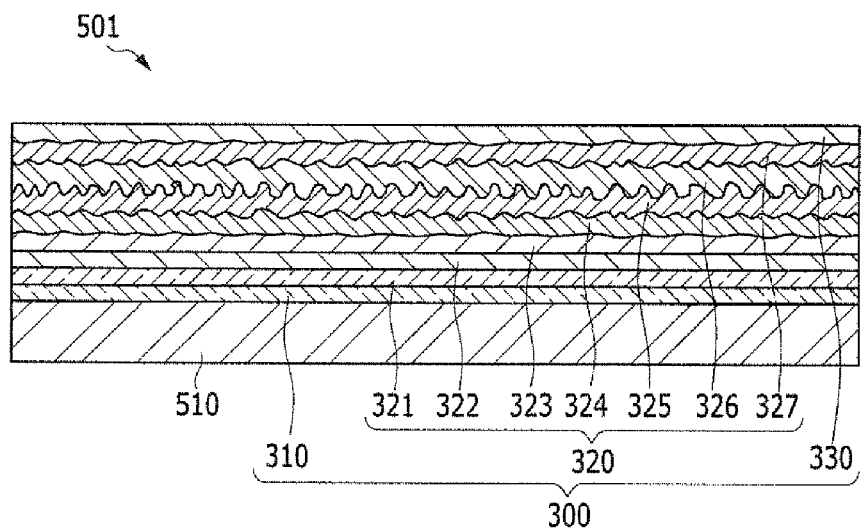
FIG. 5 shows a cross-sectional view of an organic light emitting diode (OLED) display manufactured by using a donor film of FIG. 1.

FIG. 2 to FIG. 4 sequentially show cross-sectional views for describing a method for manufacturing an organic light emitting diode display using a donor film of FIG. 1; and FIG. 5 shows a cross-sectional view of an organic light emitting diode (OLED) display manufactured by using a donor film of FIG. 1.

A first electrode 310 is formed on a display substrate 510. The display substrate 510 can be formed with a transparent insulating substrate made of glass, quartz, ceramic, or plastic, and the exemplary embodiment is not limited thereto. The first electrode 310 can be an anode electrode. The first electrode 310 can be manufactured with various materials that are known to a person skilled in the art.

At least one of a hole injection layer (HIL) 321 and a hole transport layer (HTL) 322 is formed on the first electrode 310.

For example, small molecules such as CuPc, TNATA, TCTA, or TDAPB and polymer materials such as PANI or PEDOT are usable for the hole injection layer (HIL) 321, and small molecules, such as NPB, TPD, s-TAD, MTADATA including arylamine-based small molecules, hydrazone-based small molecules, stilbene-based small molecules, starburst-based small molecules and polymers such as PVK including a carbazole polymer, a arylamine polymer, perylenes, and a pyrrole polymer, are usable for the hole transport layer (HTL) 322.

At least one of the hole injection layer (HIL) 321 and the hole transport layer (HTL) 322 can be omitted depending on the particular case.

The donor film 101 described with reference to FIG. 1 is provided. As shown in FIG. 2, the donor film 101 is disposed on the display substrate 510 so that the transfer layer 200 of the donor film 101 may face the first electrode 310.

As shown in FIG. 3, laser beams (LB) are irradiated onto a donor film 200 by using a laser irradiation device 800 so as to transfer a transfer layer 200 onto the first electrode 310. As shown in FIG. 4, the donor substrate 100 is separated from the transfer layer that is transferred onto the first electrode 310 on the display substrate 510.

As shown in FIG. 5, at least one of an electron transport layer (ETL) 326 and an electron injection layer (EIL) 327 is formed on the transferred organic emission layer 325.

For example, polymers such as PBD, TAZ, or spiro-PBD and small molecular materials such as Alq3, BAlq, or SAlq are usable for the electron transport layer (ETL) 326. Also, small molecular materials such as Alq3, a gallium (Ga) complex, or PBD, or an oxadiazole-based polymer material are usable for the electron injection layer (EIL) 327.

At least one of the electron transport layer (ETL) 326 and the electron injection layer (EIL) 327 can be omitted depending on the particular case.

A second electrode 330 is formed on at least one of the electron transport layer (ETL) 326 and the electron injection layer (EIL) 327. The second electrode 330 can be a cathode electrode. The second electrode 330 can be manufactured with various materials that are known to a person skilled in the art.

The curve of an interface between at least one of the electron transport layer (ETL) 326 and the electron injection layer (EIL) 327 and the second electrode 330 is relatively gently formed compared with the curve of an interface between the organic emission layer 325 and at least one of the electron transport layer (ETL) 326 and the electron injection layer (EIL) 327.

The hole injection layer (HIL) 321, the hole transport layer (HTL) 322, the charge generation layer 323, the assistance layer 324, the organic emission layer 325, the electron transport layer (ETL) 326, and the electron injection layer (EIL) 327 that are formed between the first electrode 310 and the second electrode 330 become an organic layer 320 for supporting light emission of the organic light emitting element 300.

According to the above-described manufacturing method, the method for manufacturing the organic light emitting diode (OLED) display using the donor film 101 according to the exemplary embodiment can stably manufacture the organic light emitting diode (OLED) display 501 of FIG. 5.

The organic light emitting diode (OLED) display 501 of FIG. 5 has excellent interlayer adhesion and luminous efficiency.

In detail, the organic light emitting diode (OLED) display 501 includes a hole injection layer (HIL) 321 and a hole transport layer (HTL) 322 that are formed on the first electrode 310 through deposition. The charge generation layer 323, the assistance layer 324, and the organic emission layer 325, which are transferred through the donor film 101 including the curved interlayer film 130 with a wrinkled surface, have wrinkles or curves.

An interface between the electron transport layer (ETL) 326, the electron injection layer (EIL) 327, and the second electrodes 330, which are formed on the organic emission layer 325 with a wrinkled surface, has wrinkles or curves.

Therefore, when the light generated by the organic emission layer 325 is transmitted through the second electrode 330, remaining phonons at the interface between the first electrode 310 and the organic emission layer 325 are caused to float, and they generate additional light as well as the light generated by the organic emission layer 325. The additional light disappears on the surface of the second electrode 330, on which a direction of the electromagnetic field is parallel, and the direction of the electromagnetic field can be controlled so as to be close to the direction which is vertical to the surface of the second electrode 330 by the wrinkles of the interface so that the generated additional light is added to the light generated by the organic emission layer 325 to increase luminous efficiency.

While the invention has been described in connection with what is presently considered to be practical exemplary embodiments thereof, it is to be understood that the invention is not limited to the disclosed embodiments, but, on the contrary, is intended to cover various modifications and equivalent arrangements included within the spirit and scope of the appended claims.

What is claimed is:

1. A donor film, comprising:
 a donor substrate, comprising:
  a base film;
  a light-to-heat conversion (LTHC) layer provided on the base film; and
  a curved interlayer film provided on the light-to-heat conversion layer and having a wrinkled side; and
 a transfer layer formed on the donor substrate, the transfer layer comprising:
  an assistance layer formed on the curved interlayer film; and
  an organic emission layer interposed between the curved interlayer film and the assistance layer and curved along a shape of the wrinkled side of the curved interlayer film,
 a surface roughness of an interface between the organic emission layer and the assistance layer being less than a surface roughness of an interface between the curved interlayer film and the organic emission layer.

2. The donor film of claim 1, wherein the transfer layer further includes one of a charge generation layer (CGL) and an organic intermediate layer formed on the assistance layer, and the assistance layer is interposed between the organic emission layer and said one of the charge generation layer (CGL) and the organic intermediate layer.

3. The donor film of claim 2, wherein a surface roughness of an interface between the assistance layer and said one of the charge generation layer and the organic intermediate layer is relatively less than the surface roughness of the interface between the organic emission layer and the assistance layer.

4. The donor film of claim 1, wherein the curved interlayer film is made of one of acrylic resin, an alkyd resin, and a silicone polymer.

5. A method for manufacturing an organic light emitting diode (OLED) display device, comprising the steps of:
 forming a first electrode on a display substrate;
 providing a donor substrate including a base film, a light-to-heat conversion (LTHC) layer provided on the base film, and a curved interlayer film provided on the light-to-heat conversion layer and having a wrinkled side;
 forming a donor film by forming a transfer layer on the donor substrate, the transfer layer comprising an assistance layer formed on the curved interlayer film and an organic emission layer interposed between the curved interlayer film and the assistance layer and curved along a shape of the wrinkled side of the curved interlayer film, a surface roughness of an interface between the organic emission layer and the assistance layer being less than a surface roughness of an interface between the curved interlayer film and the organic emission layer;
 disposing the donor film on the display substrate so that the transfer layer faces the first electrode;
 transferring the transfer layer onto the first electrode by irradiating laser beams onto the donor film; and
 separating the donor substrate from the transfer layer.

6. The method of claim 5, wherein the transfer layer further includes one of a charge generation layer (CGL) and an organic intermediate layer formed on the assistance layer, and the assistance layer is interposed between the organic emission layer and said one of the charge generation layer (CGL) and the organic intermediate layer.

7. The method of claim 6, wherein a surface roughness of an interface between the assistance layer and one of the charge generation layer and the organic intermediate layer is relatively less than the surface roughness of the interface between the organic emission layer and the assistance layer.

8. The method of claim 5, further comprising the step, before transferring the transfer layer, of forming at least one of a hole injection layer (HIL) and a hole transport layer (HTL) on the first electrode.

9. The method of claim 5, wherein the curved interlayer film is made of one of an acrylic resin, an alkyd resin, and a silicone polymer.

10. The method of claim 5, further comprising the step, after separating the donor substrate, of forming a second electrode on the organic emission layer.

11. The method of claim 10, further comprising the step, before the second electrode is formed, of forming at least one of an electron transport layer (ETL) and an electron injection layer (EIL) on the organic emission layer.

12. The method of claim 11, wherein a surface roughness of an interface between the second electrode and said at least one of the electron transport layer (ETL) and the electron injection layer (EIL) is relatively less than a curve of an interface between the organic emission layer and said at least one of the electron transport layer (ETL) and the electron injection layer (EIL).

* * * * *